(12) United States Patent
Mizukami et al.

(10) Patent No.: US 9,101,085 B2
(45) Date of Patent: Aug. 4, 2015

(54) EXPANDING DEVICE AND METHOD FOR MANUFACTURING COMPONENTS

(71) Applicant: Murata Manufacturing Co., Ltd., Nagaokakyo-shi, Kyoto-fu (JP)

(72) Inventors: Miyuki Mizukami, Nagaokakyo (JP); Naohiro Yamada, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 196 days.

(21) Appl. No.: 13/707,644

(22) Filed: Dec. 7, 2012

(65) Prior Publication Data
US 2013/0153132 A1    Jun. 20, 2013

(30) Foreign Application Priority Data
Dec. 14, 2011    (JP) .................. 2011-273018

(51) Int. Cl.
*H05K 13/00*  (2006.01)
*H01L 21/67*  (2006.01)
*H01L 21/02*  (2006.01)
*H01L 21/683* (2006.01)

(52) U.S. Cl.
CPC .......... *H05K 13/00* (2013.01); *H01L 21/67132* (2013.01); *H01L 21/02005* (2013.01); *H01L 21/6835* (2013.01); *Y10T 156/12* (2015.01)

(58) Field of Classification Search
CPC .................. H01L 21/02008; H01L 21/02005; H01L 21/02002; H01L 21/02; H01L 2221/68336; H01L 2221/68322; H01L 21/67132; H01L 21/6835; H01L 21/6836; Y10T 156/12

USPC ......... 156/229, 494, 235, 248, 249, 256, 257, 156/268, 299, 517, 518, 530, 541
See application file for complete search history.

(56) References Cited

U.S. PATENT DOCUMENTS

| 6,176,966 B1 | 1/2001 | Tsujimoto et al. |
| 2002/0195199 A1* | 12/2002 | Izutani et al. .................. 156/344 |
| 2003/0073263 A1* | 4/2003 | Kito .............................. 438/106 |

(Continued)

FOREIGN PATENT DOCUMENTS

| JP | 8-102452 A | 4/1996 |
| JP | 2007-80984 A | 3/2007 |

(Continued)

OTHER PUBLICATIONS

Official Communication issued in corresponding Taiwanese Patent Application No. 101142932, mailed on Jul. 30, 2014.

*Primary Examiner* — Linda L Gray
(74) *Attorney, Agent, or Firm* — Keating & Bennett, LLP

(57) ABSTRACT

In an expanding device that can more effectively expand an adhesive tape in its wafer-attached region and can pick up components on the adhesive tape with high accuracy, a central first portion of an adhesive tape, including a portion with a wafer attached thereto, is laid on a top surface of a heating table, a non-heated ring is disposed to surround an outer peripheral edge of the heating table, a heat insulation is laid on an upper surface of the non-heated ring, a second portion of the adhesive tape located outwardly of the first portion thereof is located on or above the insulation, a third portion of the adhesive tape located outwardly of the second portion is held by a holder, and the holder is movable up and down relative to the heating table and the non-heated ring by a drive unit.

20 Claims, 4 Drawing Sheets

(56) References Cited

U.S. PATENT DOCUMENTS

| | | | |
|---|---|---|---|
| 2005/0167800 A1* | 8/2005 | Naya | 257/678 |
| 2005/0236107 A1* | 10/2005 | Doi et al. | 156/344 |
| 2006/0226520 A1* | 10/2006 | Yoshimura et al. | 257/666 |
| 2006/0252233 A1* | 11/2006 | Honma et al. | 438/464 |
| 2012/0100697 A1* | 4/2012 | Yasuda et al. | 438/464 |

FOREIGN PATENT DOCUMENTS

| | | |
|---|---|---|
| JP | 2007-081352 A | 3/2007 |
| JP | 2007-142199 A | 6/2007 |
| KR | 10-1999-0006863 A | 1/1999 |
| TW | M359789 | 6/2009 |

* cited by examiner

EXPANDING DEVICE AND METHOD FOR MANUFACTURING COMPONENTS

BACKGROUND OF THE INVENTION

1. Field of the Invention

The present invention relates to an expanding device for expanding an adhesive tape with a wafer attached to one side thereof and a method for manufacturing components using the expanding device.

2. Description of the Related Art

Adhesive tapes are now widely used to increase mass productivity of electronic components. More specifically, first, a wafer is attached to one side of an adhesive tape. Next, the wafer is divided by dicing into a plurality of rectangular chips to define components. Thereafter, the adhesive tape is expanded to widen the spaces between the components. Next, the individual components are picked up.

Various expanding devices are proposed as devices for expanding such an adhesive tape as described above. For example, JP-A No. 2007-81352 below discloses an expanding device shown in FIG. 8. In this expanding device 1001, an adhesive tape 1003 is laid on a heating table 1002. Although not shown, a wafer to be divided is attached on top of the adhesive tape 1003.

A peripheral portion of the adhesive tape 1003 is attached to the top surface of an upper expanding ring 1004. The upper expanding ring 1004 with the adhesive tape 1003 attached thereto is placed on a lower expanding ring 1005.

After the wafer is diced, the adhesive tape 1003 is expanded outward as shown in the arrow A. Thus, the spaces between components obtained by dicing the wafer are extended.

In the expanding device 1001, the adhesive tape 1003 is heated by the heating table 1002 in order to facilitate the expansion of the adhesive tape 1003. The heating table 1002 is fixed to the upper end of a shaft 1006. The shaft 1006 is connected through unshown other members to the lower expanding ring 1005. All these members are made of metal or like materials because they are required to have adequate mechanical strength. Therefore, heat from the heating table 1002 is conducted to the shaft 1006, then the lower expanding ring 1005, and then the upper expanding ring 1004. As a result, heat is applied not only to a region of the adhesive tape 1003 having the wafer attached thereto but also to a peripheral region thereof in contact with the upper expanding ring 1004. Therefore, the adhesive tape 1003 is expanded even in the region outward of the wafer-attached region. Furthermore, particularly a portion of the upper expanding ring 1004 connected with the shaft 1006 reaches a higher temperature than the rest. This temperature difference makes it difficult for the adhesive tape 1003 to be isotropically expanded, resulting in variations in degree of expansion. Therefore, the adhesive tape 1003 is difficult to sufficiently expand in its central, wafer-attached region. As a result, the spaces between the components are less likely to be extended evenly and sufficiently, which makes it difficult to certainly pick up the components.

SUMMARY OF THE INVENTION

Preferred embodiments of the present invention provide an expanding device that can more effectively expand an adhesive tape in its wafer-attached region and can pick up components on the adhesive tape with high accuracy, and also provide a method for manufacturing components using the expanding device.

An expanding device according to a preferred embodiment of the present invention includes a heating table, a non-heated ring, a heat insulation, a holder, and a drive unit. A central first portion of an adhesive tape, including a portion with a wafer attached thereto, is laid on a top surface of the heating table. The non-heated ring is disposed to surround an outer peripheral edge of the heating table. The heat insulation is laid on an upper surface of the non-heated ring. A second portion of the adhesive tape located outwardly of the first portion thereof is to be laid directly or indirectly on an upper surface of the heat insulation. The holder is configured to hold a third portion of the adhesive tape located outwardly of the second portion. The drive unit is a device that moves the heating table and the non-heated ring up and down relative to the holder to expand the adhesive tape.

In a particular aspect of the expanding device according to a preferred embodiment of the present invention, the upper surface of the non-heated ring is located below the top surface of the heating table to prevent the adhesive tape from contacting with the upper surface of the non-heated ring. In this case, the adhesive tape is less likely to directly receive heat from the non-heated ring. Therefore, the expansion rate of the first portion of the adhesive tape can be further increased.

In another particular aspect of the expanding device according to a preferred embodiment of the present invention, the non-heated ring includes an indentation provided in the upper surface thereof, a frame is disposed in the indentation, and an upper surface of the frame is flush with an upper surface of a portion of the non-heated ring other than the indentation. Thus, the expanding device may be configured so that the upper surface of the non-heated ring is brought into contact with the lower surface of the adhesive tape.

In still another particular aspect of the expanding device according to a preferred embodiment of the present invention, the non-heated ring is disposed with a clearance so as to be spaced from the outer peripheral edge of the heating table. In this case, the non-heated ring is not likely to cause heat transfer due to conduction of heat from the outer peripheral edge of the heating table.

In still another particular aspect of the expanding device according to a preferred embodiment of the present invention, the expanding device further includes a connecting member connecting the heating table to the non-heated ring and a second heat insulation is provided at a portion of the connecting member. In this case, the second heat insulation can effectively reduce and prevent a temperature increase of the non-heated ring.

In still another particular aspect of the expanding device according to a preferred embodiment of the present invention, the top surface of the heating table has an area equal to or smaller than that of a region of the adhesive tape occupied by a plurality of components of the wafer after the adhesive tape is expanded. In this case, heating to a region of the adhesive tape outward of the region thereof occupied by the plurality of components after the expansion can be effectively reduced and prevented.

A method for manufacturing components according to a preferred embodiment of the present invention is a manufacturing method using the expanding device according to another preferred embodiment of the present invention.

A manufacturing method according to a preferred embodiment of the present invention includes the steps of attaching a wafer divided into individual components to an upper surface of the adhesive tape; placing the adhesive tape so that the first portion of the adhesive tape is located on top of the heating table of the expanding device and the second portion thereof is laid directly or indirectly on the insulation; and moving the heating table and the non-heated ring downward relative to the holder using the drive unit to extend spaces between the plurality of components.

In the expanding device according to various preferred embodiments of the present invention and the manufacturing method using the same, the frame is laid through the heat insulation on the non-heated ring, so that heat conducted from the heating table to the non-heated ring is much less likely to be conducted upward from the heat insulation. Therefore, the first portion can be effectively expanded by heat from the heating table and concurrently the expansion of the second portion can be suppressed. Hence, the spaces between the plurality of components can be sufficiently extended and the degree of expansion is less likely to vary. As a result, the individual components after being diced can be picked up with high accuracy.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the details of the present invention will be clarified by the following detailed description of specific preferred embodiments of the present invention and with reference to the drawings.

Figure 1A:
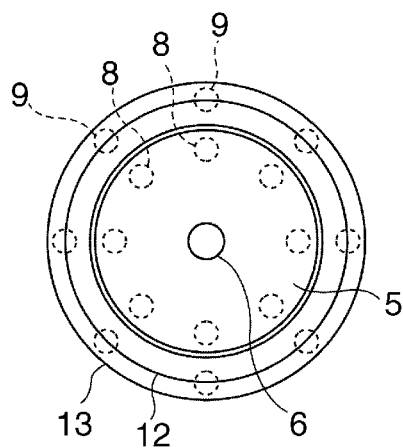
FIG. 1A is a schematic plan view showing a relevant portion of an expanding device used in a preferred embodiment of the present invention.
Figure 1B:
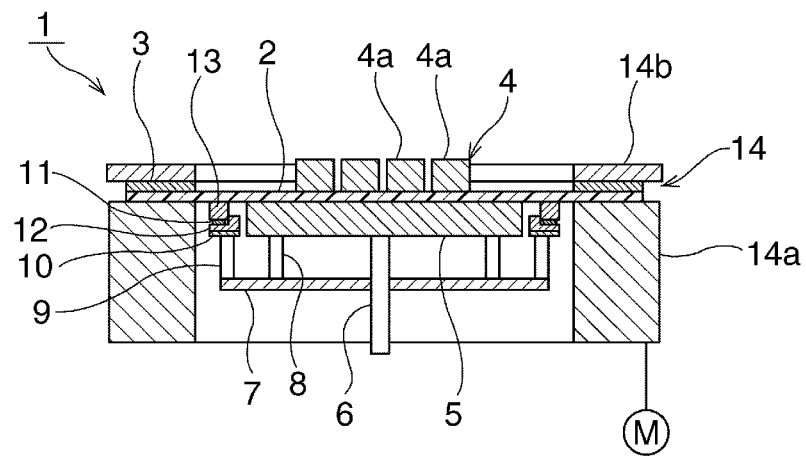
FIG. 1B is a front cross-sectional view of the expanding device.

FIG. 1B is a front cross-sectional view for illustrating an expanding device according to a preferred embodiment of the present invention. The expanding device 1 is a device for expanding an adhesive tape 2 radially outward. The adhesive tape 2 preferably is made of a synthetic resin film material having tackiness at least on the top side.

The adhesive tape 2 preferably has a flat, circular or substantially circular shape. A holding ring 3 is fixed on the upper surface of the adhesive tape 2 in the vicinity of the peripheral edge of the same. A configuration including the adhesive tape 2 secured by the holding ring 3 is provided on the expanding device 1 as shown in FIG. 1B.

Furthermore, the upper surface of the adhesive tape 2 has tackiness and a wafer 4 is adhesively fixed to the upper surface of the adhesive tape 2. The wafer 4 is divided into a plurality of components 4a by dicing. In the case of the expanding device 1 of the present preferred embodiment, as shown in FIG. 1B, a structure with the already diced wafer 4 adhesively fixed to the adhesive tape 2 is set on the expanding device 1.

The expanding device 1 includes a disc-shaped heating table 5. The heating table 5 is not limited to a circular or substantially circular plan shape and may have any other plan shape, such as a rectangular or substantially rectangular shape.

A ball screw 6 is fixed at the upper end to the under surface of the heating table 5.

The heating table 5 is configured so that the top surface thereof has an area equal to or smaller than the area of a region of the adhesive tape 2 occupied by the plurality of components 4a after the adhesive tape 2 is expanded. However, the area of the top surface of the heating table 5 may be larger than the area of the region of the adhesive tape 2 occupied by the plurality of components 4a after the adhesive tape 2 is expanded.

The heating table 5 acts to heat the adhesive tape 2. Thus, a portion of the adhesive tape 2 located on the top surface of the heating table 5, i.e., a central, first portion thereof, can be easily expanded. Since the heating table 5 is required to heat the adhesive tape 2, it is preferably made of a material having superior thermal conductivity, such as metal, for example. In the present preferred embodiment, the heating table 5 is preferably made of metal.

A support plate 7 is disposed below the heating table 5 and opposite to the under surface of the heating table 5. The support plate 7 includes a screw hole at the center and the ball screw 6 is screwed in the screw hole. The heating table 5 can be moved up and down by turning the support plate 7 about the ball screw 6.

In addition, the under surface of the heating table 5 and the top surface of the support plate 7 are connected by a plurality of rods 8 arranged in the circumferential direction of the heating table 5.

The support plate 7 is a disc-shaped member having a larger area than the heating table 5. The support plate 7 is preferably made of a rigid material, such as metal, for example. Preferably, the support plate 7 is made of metal because of its superior mechanical strength and low price. The support plate 7 is disposed concentrically with the heating table 5. Furthermore, the support plate 7 has a larger area than the heating table 5.

A plurality of connecting rods 9 stand on the top surface of the support plate 7 in the vicinity of the outer peripheral edge. The plurality of connecting rods 9 are evenly distributed in the circumferential direction of the support plate 7.

The connecting rods 9 are made of metal but may be made of any other rigid material.

Now, the positions of the plurality of rods 8 and connecting rods 9 will be explained with reference to FIG. 1A. FIG. 1A is a schematic plan view of an inner portion of the expanding device 1 surrounded by a holder 14, wherein the adhesive tape 2 and the wafer 4 have not been set. As seen from FIG. 1A, both of the plurality of rods 8 and the plurality of connecting rods 9 are evenly distributed in the circumferential direction.

Figure 1C:
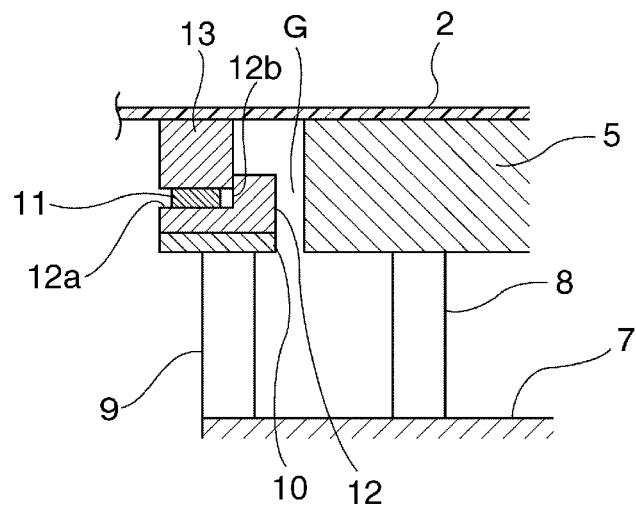
FIG. 1C is a partly cut-away front cross-sectional view showing in enlarged dimension a relevant portion of the expanding device.

Referring to FIG. 1C showing the relevant portion in enlarged dimension, a first heat insulation 10 is laid on the upper end surfaces of the connecting rods 9. A non-heated ring 12 is fixed on the first heat insulation 10. The non-heated ring 12 is preferably made of metal but may be made of any other rigid material. In the present preferred embodiment, the non-heated ring 12 is preferably made of metal because of its high strength and superior dimensional stability.

A clearance G is provided between the inner periphery of the non-heated ring 12 and the outer periphery of the heating table 5. However, the inner periphery of the non-heated ring 12 may be in contact with the outer periphery of the heating table 5. Preferably, the clearance G should be provided. Thus, as will be described later, heating of the non-heated ring 12 can be significantly reduced and prevented to further increase the expansion rate of the first portion of the adhesive tape 2.

The non-heated ring 12 preferably has an approximately annular shape and has an indentation 12a provided in the upper surface thereof. The indentation 12a opens radially outward at the upper surface of the non-heated ring 12. A second heat insulation 11 is laid on the bottom surface of the indentation 12a. The second heat insulation 11, like the first heat insulation 10, has a heat insulating effect. Therefore, the first and second heat insulations 10, 11 can be made of any appropriate heat insulating material having lower heat conductivity than the non-heated ring 12. Preferably, the first and second heat insulations 10, 11 are made of resin because of superior heat insulating properties. In the present preferred embodiment, the first and second heat insulations 10, 11 preferably are made of glass epoxy resin, for example.

Furthermore, as shown in FIG. 1C, the upper surface of the second heat insulation 11 is located below the upper surface of the non-heated ring 12. Thus, a frame 13 to be described later can be partially received in the indentation 12a. As a result, the frame 13 can be stably disposed on the non-heated ring 12. More preferably, the inside diameter of the annular frame 13 is equal to or slightly smaller than the diameter of an annular vertical wall 12b of the indentation 12a of the non-heated ring 12. Thus, the frame 13 can be brought into close contact with the annular vertical wall 12b. This prevents displacement of the frame 13.

The frame 13 preferably has an annular shape. The upper surface of the frame 13 is on the same level as the top surface of the heating table 5. Thus, as shown in FIG. 1B, these members can stably support the flat adhesive tape 2.

The frame 13 is made of a rigid material, such as metal. Since the frame 13 is made of a rigid material, such as metal, the upper surface of the frame 13 can be accurately located on the same level as the top surface of the heating table 5.

The upper surface of the frame 13 is in contact with the lower surface of a second portion of the adhesive tape 2. The second portion is a doughnut-shaped region of the adhesive tape 2 located outwardly of the previously-described first portion thereof. The first portion, as described previously, is a portion of the adhesive tape 2 located on top of the heating table 5. The second portion is a ring-shaped region located outwardly of the outer peripheral edge of the heating table 5. The adhesive tape 2 further includes a ring-shaped, third portion located outwardly of the second portion. The adhesive tape 2 is held at the third portion, together with the holding ring 3, by the holder 14. The holder 14 includes a first holding member 14a located on the lower side and a second holding member 14b located on the upper side. The third portion of the adhesive tape 2 and the holding ring 3 are clamped and fixed between the first and second holding members 14a, 14b.

The holder 14 is configured so that it can be moved up and down by a drive unit M schematically shown in FIG. 1B. More specifically, the holder 14 is configured so that it can be moved up and down independent of the heating table 5, the frame 13, and the non-heated ring 12.

Next, a description will be given of a preferred embodiment of a method for manufacturing components using the above expanding device 1.

Figure 2:
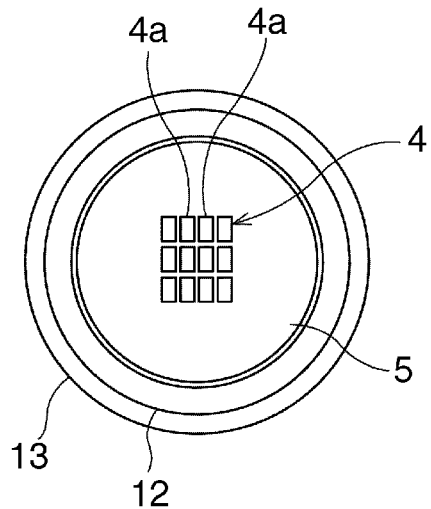
FIG. 2 is a schematic plan view for illustrating the relative positions of a plurality of components after dicing on a heating table and before expansion of an adhesive tape in the expanding device of a preferred embodiment of the present invention.

First, as shown in FIG. 1B, an adhesive tape 2 with a diced wafer 4 attached thereto is placed on the expanding device 1. FIG. 2 is a plan view showing this state, wherein the diced wafer 4, i.e., the wafer 4 divided into a plurality of components 4a, is located on a central region of the adhesive tape 2. This region occupied by the plurality of components 4a has a smaller area than the top surface of the heating table 5. Next, the outer peripheral portion of the adhesive tape 2 is clamped and fixed, together with the holding ring 3, by the second holding member 14b and the first holding member 14a.

Figure 3:
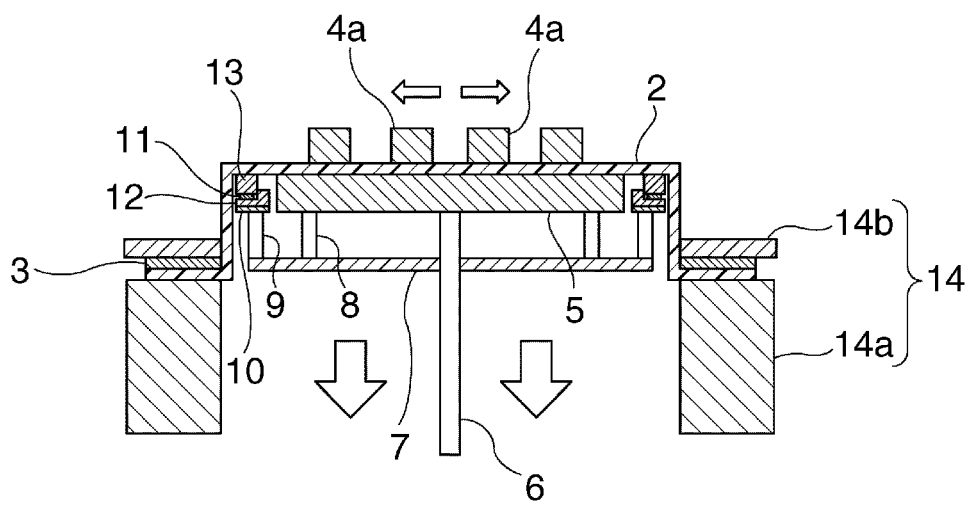
FIG. 3 is a front cross-sectional view showing a state after the adhesive tape is expanded using the expanding device of a preferred embodiment of the present invention.
Figure 4:
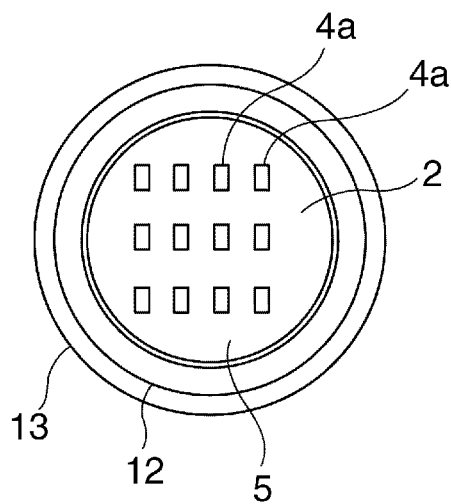
FIG. 4 is a schematic plan view for illustrating the relative positions of the plurality of components after dicing on the heating table and after expansion of the adhesive tape in the expanding device of a preferred embodiment of the present invention.

Thereafter, the drive unit M is operated to move the heating table 5 and the frame 13 upward relative to the holder 14 as shown in FIG. 3. Thus, the first portion of the adhesive tape 2 located on the inner side thereof moves up. As a result, the adhesive tape 2 is expanded radially outward. This is accompanied by the extension of the spaces between the adjacent components 4a as shown in FIG. 3. This state is shown in plan view in FIG. 4. As shown in FIG. 4, the spaces between the components 4a are extended. The region of the adhesive tape 2 occupied by the plurality of components 4a has a slightly smaller area than the top surface of the heating table 5. Preferably, the area of the region of the adhesive tape 2 occupied by the plurality of components 4a after the above expansion is equal to or larger than the area of the top surface of the heating table 5. Thus, space saving can be promoted and the expansion rate of the above region can be effectively increased.

The area of the top surface of the heating table 5 is preferably selected so that where the diameter of the heating table 5 is represented by D, D≤(dimension per side of region occupied by components 4a before expansion)×(expansion rate)× $(2)^{1/2}$. Thus, for example, if a square region occupied by the plurality of components 4a before expansion is 100 mm on a side and the required expansion rate is 110%, 100 mm×110 (%)×$(2)^{1/2}$=150 mm. Therefore, the diameter of the heating table 5 should be 150 mm or less, for example.

When the spaces between the adjacent components 4a are extended as described above, the individual components 4a can be easily and efficiently picked up by a pickup device. As described previously, the expanding device 1 is a device for extending the spaces between the plurality of components 4a.

Figure 5:
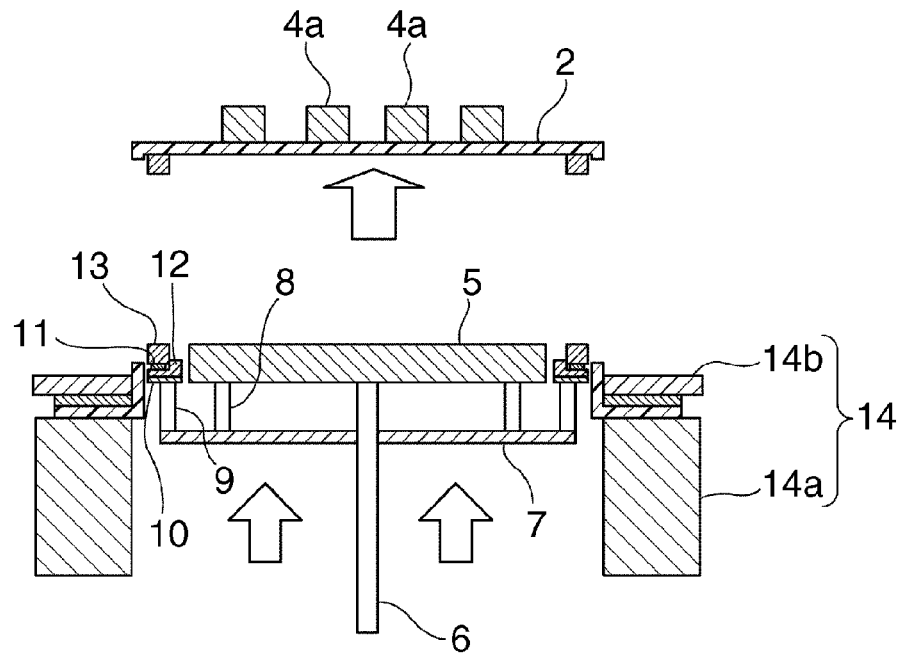
FIG. 5 is a schematic front cross-sectional view for illustrating the step of removing the plurality of component chips from the adhesive tape after the expansion.

Next, as shown in FIG. 5, the adhesive tape 2 after being expanded is cut at the second portion. Then, as shown in FIG. 5, the cut adhesive tape 2 is removed upward together with the plurality of components 4a. In this removal, the frame 13 is also removed unitarily with the adhesive tape 2. Therefore, the expanded adhesive tape 2 can be easily and certainly moved toward the pickup device.

In the expanding device 1 of the present preferred embodiment, as seen from the above, the adhesive tape 2 can be easily expanded by heating the heating table 5. When the heating table 5 is heated, heat is conducted through the ball screw 6, the support plate 7, and the connecting rods 9, all of which are made of metal, to the non-heated ring 12 and the frame 13. However, the frame 13 is less likely to be heated since the first and second heat insulations 10, 11 are present along the path from the heating table 5 to the frame 13. Therefore, the second portion of the adhesive tape 2 is less likely to be expanded than the first portion thereof. Thus, the expansion rate of the first portion can be effectively increased. In addition, the expansion rate is less likely to vary. Thus, the spaces between the plurality of components 4a are less likely to vary.

Furthermore, in the above preferred embodiment, a clearance G is preferably provided between the outer periphery of the heating table 5 and the inner periphery of the non-heated ring 12. Therefore, this also increases the expansion rate of the adhesive tape 2. Experiments by the inventor have revealed that, supposing that the expansion rate of the adhesive tape when heated to 42° C. in the case of no clearance G be 100%, the expansion rate thereof in the case of a clearance G of 5 mm can be increased to 102% even when the adhesive tape is heated to 34.0° C., for example.

In a conventional expanding device of this type, as described previously, when the heating table is heated, the members connected to the heating table are also raised in temperature. Therefore, there arises a problem in that the expansion rate is likely to vary until the temperature of the members close to the adhesive tape 2, such as the non-heated ring, achieves the same level as that of the heating table 5. In contrast, in the expanding device 1 of the above preferred embodiment, variability in expansion rate can be made small from an early stage after the start of heating of the heating table 5.

Figure 6:
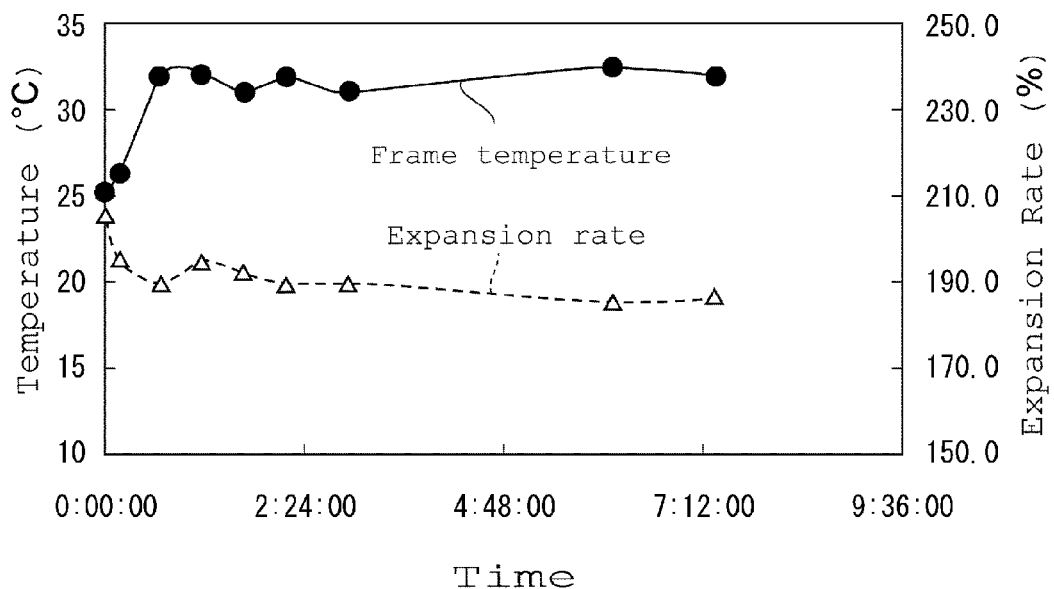
FIG. 6 is a graph showing changes in expansion rate and frame temperature with time in the step of extending component spaces using the expanding device according to a preferred embodiment of the present invention.

As is evident from FIG. 6, it can be seen that when the frame 13 is raised in temperature, the expansion rate is slightly lowered. The experiments by the inventor have given the following result: when the temperature of the heating table 5 was 60° C. and the temperature of the frame 13 was 38° C., the expansion rate of the adhesive tape 2 was set at 100% as a reference; in this case, it was confirmed that when the temperature of the frame 13 was 25° C., the expansion rate could be increased to 103%, for example. This result shows that the expansion rate can be effectively increased by providing the first and second heat insulations 10, 11 to significantly reduce and prevent the temperature rise of the frame 13. The term "expansion rate" herein refers to the rate of the distance between the farthest two components of the wafer after expansion to the distance between the farthest two components of the wafer before expansion.

Figure 7:
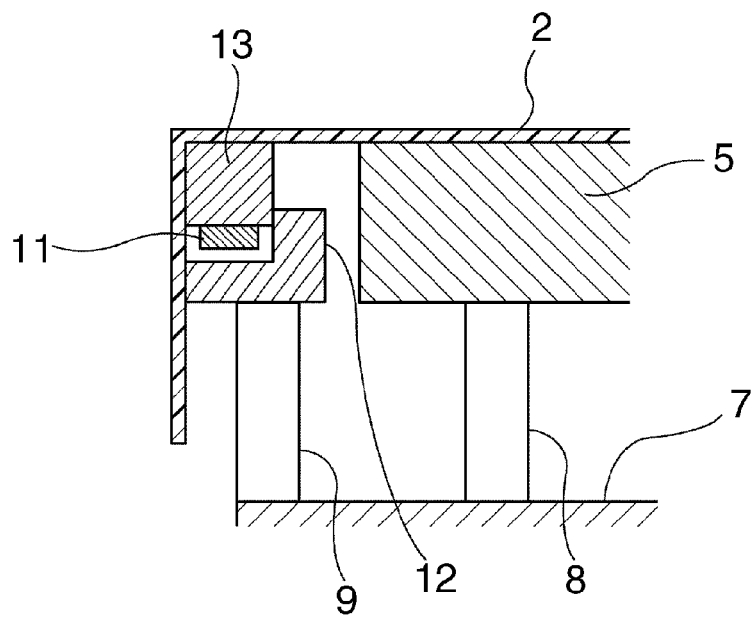
FIG. 7 is a partly cut-away front cross-sectional view for illustrating an expanding device according to a modification of a preferred embodiment of the present invention.
Figure 8:
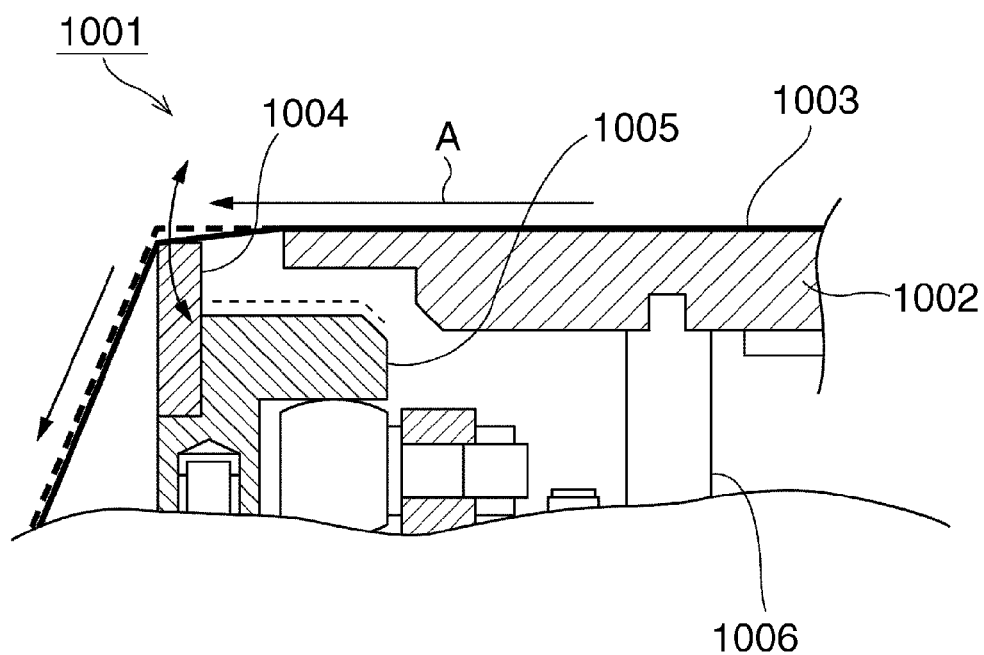
FIG. 8 is a partly cut-away front cross-sectional view showing an example of a conventional expanding device.

Although in the above preferred embodiment the first heat insulation 10 is provided on the lower surface of the non-heated ring 12, the first heat insulation 10 may be dispensed with as shown in FIG. 7. However, not only the second heat insulation 11 but also the first heat insulation 10 are preferably provided. Thus, the temperature rise of the frame 13 can be effectively reduced and prevented.

Although in the above preferred embodiment, the first and second heat insulations 10, 11 preferably have an annular shape, for example, they may have any other shape. For example, a plurality of second heat insulations 11 may be distributed circumferentially on the upper surface of the non-heated ring 12. Likewise, a plurality of first heat insulations 10 may be distributed circumferentially on the lower surface of the non-heated ring 12.

Furthermore, although in the above preferred embodiment the frame 13 is preferably provided, the frame 13 may be dispensed with. In this case, it may be necessary to increase the thickness of the second insulation 11 and lay the second portion of the adhesive tape 2 directly on the upper surface of the second heat insulation 11.

In the manufacturing method of the above preferred embodiment, the wafer 4 is preferably diced prior to setting of the adhesive tape 2 on the expanding device 1. Instead of this, dicing may be performed on the heating table 5 in a state that the adhesive tape 2 with the wafer 4 attached thereto is laid on the heating table 5.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An expanding device comprising:
   a heating table on a top surface of which a central first portion of an adhesive tape, including a portion with a wafer attached thereto, is provided;
   a non-heated ring arranged to surround an outer peripheral edge of the heating table;
   a heat insulation which is provided on an upper surface of the non-heated ring and on which a second portion of the adhesive tape located outwardly of the first portion thereof is directly or indirectly provided;
   a holder arranged to hold a third portion of the adhesive tape located outwardly of the second portion; and
   a drive unit arranged to move the heating table and the non-heated ring up and down relative to the holder to expand the adhesive tape.

2. The expanding device according to claim 1, wherein the upper surface of the non-heated ring is located below the top surface of the heating table to prevent the adhesive tape from contacting with the upper surface of the non-heated ring.

3. The expanding device according to claim 1, wherein the non-heated ring includes an indentation located in the upper surface thereof, a frame is disposed in the indentation, and an upper surface of the frame is flush with an upper surface of a portion of the non-heated ring other than the indentation.

4. The expanding device according to claim 1, wherein the non-heated ring is spaced from the outer peripheral edge of the heating table.

5. The expanding device according to claim 2, wherein the non-heated ring is spaced from the outer peripheral edge of the heating table.

6. The expanding device according to claim 3, wherein the non-heated ring is spaced from the outer peripheral edge of the heating table.

7. The expanding device according to claim 1, further comprising a connecting member connecting the heating table to the non-heated ring, and an additional heat insulation provided at a portion of the connecting member.

8. The expanding device according to claim 2, further comprising a connecting member connecting the heating table to the non-heated ring, and an additional heat insulation provided at a portion of the connecting member.

9. The expanding device according to claim 3, further comprising a connecting member connecting the heating table to the non-heated ring, and an additional heat insulation provided at a portion of the connecting member.

10. The expanding device according to claim 4, further comprising a connecting member connecting the heating table to the non-heated ring, and an additional heat insulation provided at a portion of the connecting member.

11. The expanding device according to claim 5, further comprising a connecting member connecting the heating table to the non-heated ring, and an additional heat insulation provided at a portion of the connecting member.

12. The expanding device according to claim 6, further comprising a connecting member connecting the heating table to the non-heated ring, and an additional heat insulation provided at a portion of the connecting member.

13. The expanding device according to claim 1, wherein the top surface of the heating table has an area equal to or smaller than that of a region of the adhesive tape occupied by a plurality of components of the wafer after the adhesive tape is expanded.

14. The expanding device according to claim 2, wherein the top surface of the heating table has an area equal to or smaller than that of a region of the adhesive tape occupied by a plurality of components of the wafer after the adhesive tape is expanded.

15. The expanding device according to claim 3, wherein the top surface of the heating table has an area equal to or smaller than that of a region of the adhesive tape occupied by a plurality of components of the wafer after the adhesive tape is expanded.

16. The expanding device according to claim 4, wherein the top surface of the heating table has an area equal to or smaller than that of a region of the adhesive tape occupied by a plurality of components of the wafer after the adhesive tape is expanded.

17. The expanding device according to claim 5, wherein the top surface of the heating table has an area equal to or smaller than that of a region of the adhesive tape occupied by a plurality of components of the wafer after the adhesive tape is expanded.

18. The expanding device according to claim 6, wherein the top surface of the heating table has an area equal to or smaller than that of a region of the adhesive tape occupied by a plurality of components of the wafer after the adhesive tape is expanded.

19. The expanding device according to claim 7, wherein the top surface of the heating table has an area equal to or smaller than that of a region of the adhesive tape occupied by a plurality of components of the wafer after the adhesive tape is expanded.

20. A method for manufacturing components using the expanding device according to claim 1, the method comprising the steps of:
- placing the adhesive tape so that the first portion of the adhesive tape is located on top of the heating table of the expanding device and the second portion thereof is laid directly or indirectly on the insulation; and
- moving the heating table and the non-heated ring downward relative to the holder using the drive unit to extend spaces between the plurality of components.

* * * * *